United States Patent
Jeong

(10) Patent No.: US 9,698,162 B2
(45) Date of Patent: Jul. 4, 2017

(54) BACKPLANE SUBSTRATE AND FLEXIBLE DISPLAY USING THE SAME

(71) Applicant: LG Display Co., Ltd., Seoul (KR)

(72) Inventor: Hae-Yeon Jeong, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/976,081

(22) Filed: Dec. 21, 2015

(65) Prior Publication Data

US 2017/0062532 A1 Mar. 2, 2017

(30) Foreign Application Priority Data

Aug. 31, 2015 (KR) .................... 10-2015-0123049

(51) Int. Cl.
- H01L 27/12 (2006.01)
- H01L 27/32 (2006.01)
- H01L 51/00 (2006.01)
- H01L 51/50 (2006.01)

(52) U.S. Cl.
CPC ........ H01L 27/1218 (2013.01); H01L 27/124 (2013.01); H01L 27/3246 (2013.01); H01L 27/3248 (2013.01); H01L 27/3276 (2013.01); H01L 51/0097 (2013.01); H01L 51/50 (2013.01)

(58) Field of Classification Search
CPC .............. H01L 27/1218; H01L 27/124; H01L 27/3246; H01L 27/3248; H01L 27/3276; H01L 51/0097; H01L 51/50

See application file for complete search history.

(56) References Cited

U.S. PATENT DOCUMENTS

| | | | |
|---|---|---|---|
| 2011/0090159 A1* | 4/2011 | Kurashima | G06F 3/044 345/173 |
| 2011/0297942 A1* | 12/2011 | Kim | H01L 27/3276 257/59 |
| 2014/0353670 A1* | 12/2014 | Youn | H01L 27/124 257/72 |
| 2015/0187279 A1* | 7/2015 | Lee | G09G 3/3225 257/40 |
| 2015/0207102 A1* | 7/2015 | Jeong | H04M 1/0268 257/40 |
| 2015/0314561 A1* | 11/2015 | Kim | B32B 27/302 428/201 |
| 2016/0035761 A1* | 2/2016 | Kwon | H01L 27/124 257/72 |
| 2016/0079539 A1* | 3/2016 | Kim | H01L 27/3244 257/40 |
| 2016/0239133 A1* | 8/2016 | Ko | G06F 1/1643 |

* cited by examiner

*Primary Examiner* — Allan R Wilson

(74) *Attorney, Agent, or Firm* — Morgan, Lewis & Bockius LLP

(57) ABSTRACT

A backplane substrate and a flexible display having the same are provided. The backplane substrate includes a flexible base film having an active area with a plurality of sub-pixels and a non-display area around the active area; and an interlayer insulating film on flexible base film and including a plurality of connection holes provided in first columns and second columns with each of the first and second columns arranged in a first direction of the flexible base film. When the flexible base film is folded along a folding axis in a direction intersecting the first and second columns, the folding axis intersects at least one connection hole of the first and second columns.

23 Claims, 16 Drawing Sheets

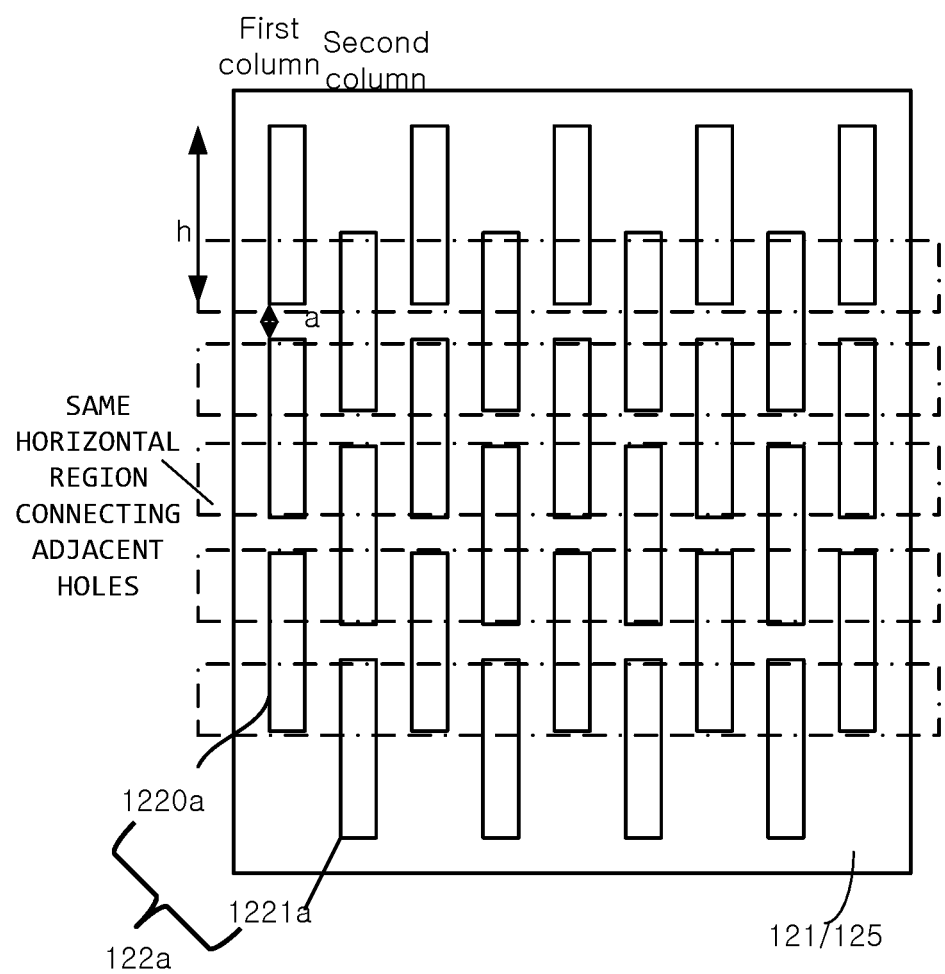

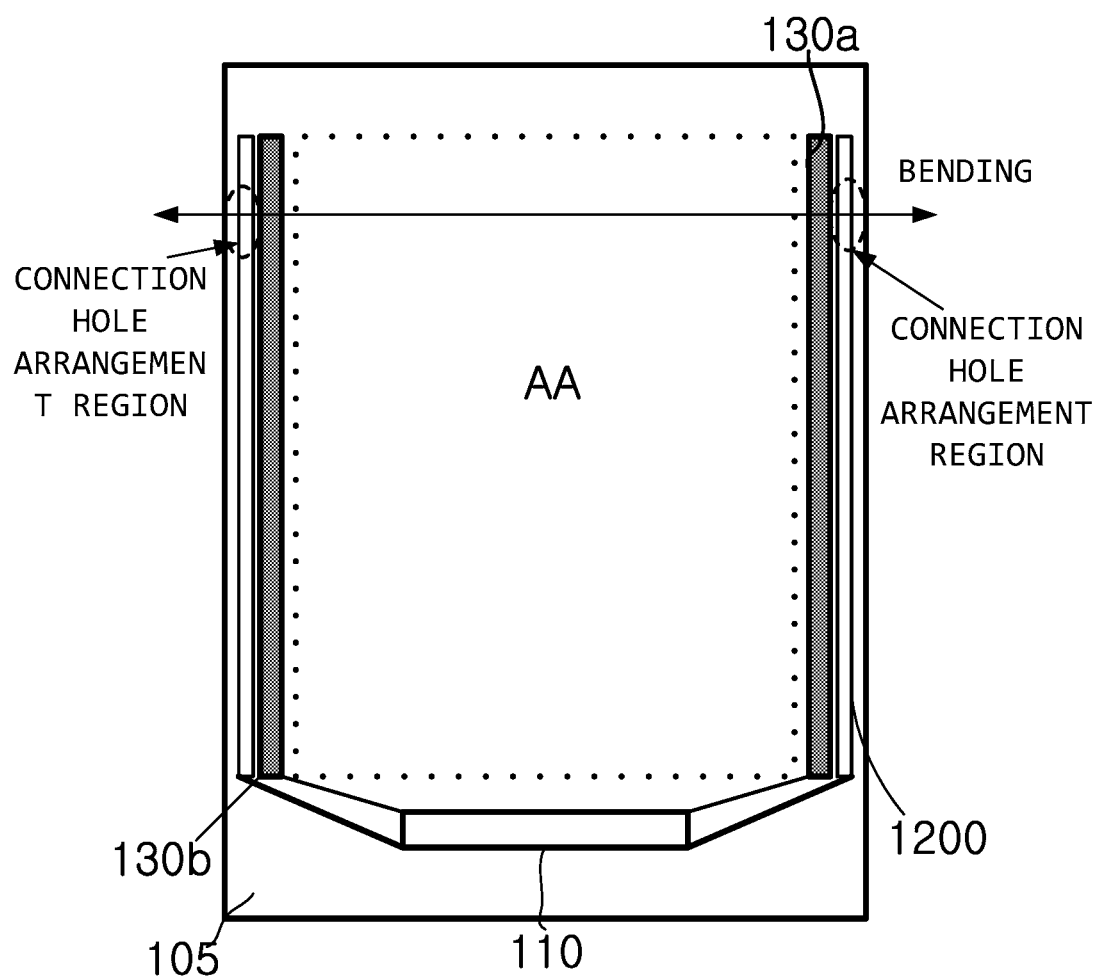

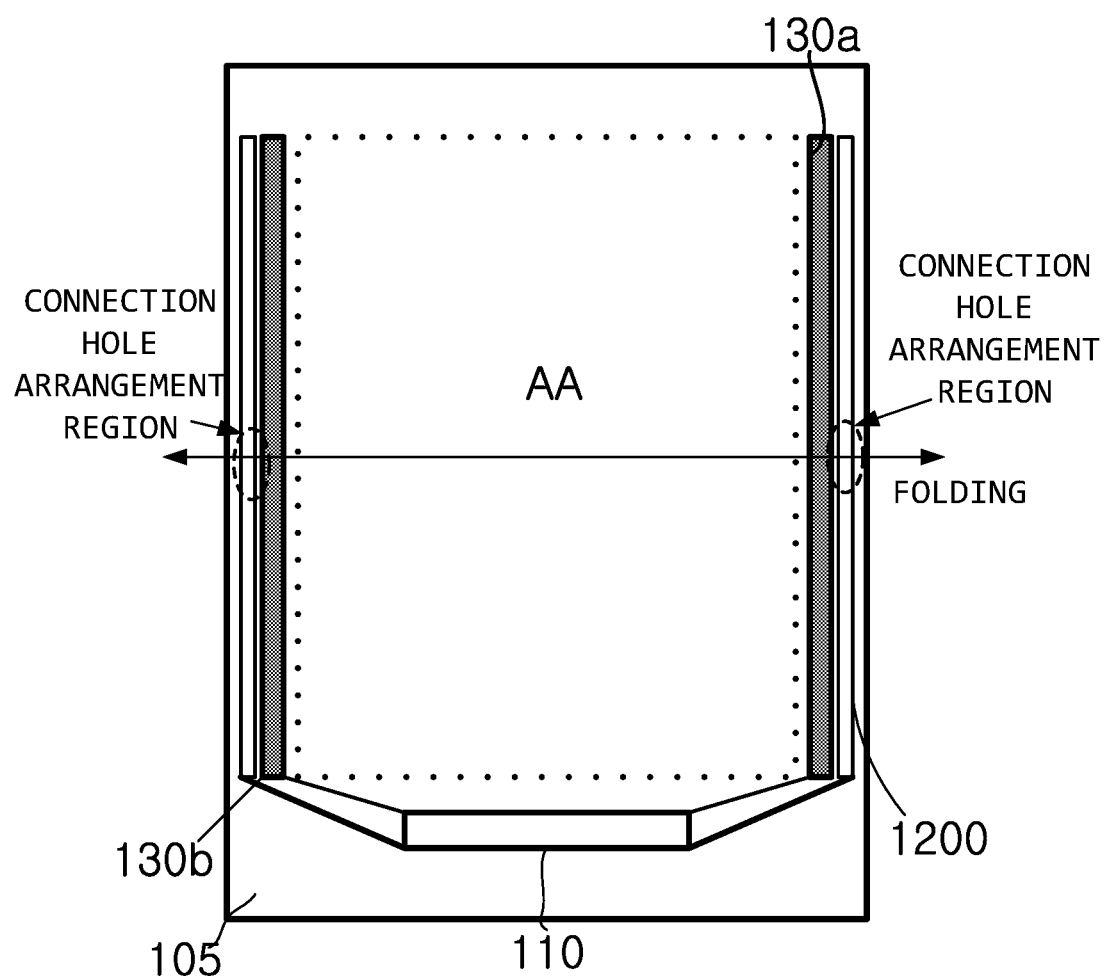

BACKPLANE SUBSTRATE AND FLEXIBLE DISPLAY USING THE SAME

This application claims the benefit of Korean Patent Application No. 10-2015-0123049, filed on Aug. 31, 2015, which is hereby incorporated by reference as if fully set forth herein.

BACKGROUND OF THE INVENTION

Field of the Invention

The present invention relates to a display device, and more particularly, to a backplane substrate for a flexible display device and a flexible display device having a backplane substrate.

Discussion of the Related Art

Representative examples of flat display devices include liquid crystal displays (LCDs), organic emitting display devices, plasma display panels (PDPs), quantum dot display devices, field emission displays (FEDs), electrophoretic displays (EPDs), etc. These display devices essentially include a flat display panel for displaying an image, and the flat display panel includes a pair of transparent insulating substrates bonded to each other by an intrinsic light emitting layer, light polarizing layer, or other organic material layer interposed therebetween.

Recently, to satisfy a trend toward large-sized display devices, flat display devices having small space occupancy have been required. Such requirements continue to increase, and thus, flexible flat display devices are increasingly in demand.

Flexible displays have gradually developed that are thin or are foldable at a designated angle. However, if a flexible display uses a flexible substrate as a base so as to execute a bending or folding motion, the flexible substrate is weak in terms of physical properties and causes severe cracks at the edge part thereof after a process of scribing an effective area, as compared to a glass substrate. Further, when the folding or bending motion is repeated, a crack generated at the edge part of the flexible substrate may be grown to an active area of the flexible display, thus causing lighting fault on lines or malfunction of a specific part.

SUMMARY

Accordingly, the present invention is directed to a backplane substrate and a flexible display using the same that substantially obviate one or more problems due to limitations and disadvantages of the related art.

An object of the present invention is to provide a backplane substrate that prevents influence by a crack seed penetrated to the inside from the edge thereof so as to increase reliability, and a flexible display using the same.

Another object of the present invention is to provide a backplane substrate that prevents influence by a crack seed penetrated to the inside from the edge thereof so as to increase reliability and a flexible display using the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a backplane substrate comprises a flexible base film having an active area with a plurality of sub-pixels and a non-display area around the active area; and an interlayer insulating film on the flexible base film and including a plurality of connection holes provided in first columns and second columns with each of the first and second columns arranged in a first direction of the flexible base film, wherein, when the flexible base film is folded along a folding axis in a direction intersecting the first and second columns, the folding axis intersects at least one connection hole of the first and second columns.

In another aspect, a flexible display comprises a flexible base film having an active area with a plurality of sub-pixels provided in a matrix and a non-display area around the active area; first wirings on the non-display area of the flexible base film; an interlayer insulating film provided on the flexible base film covering the first wirings, the interlayer insulating film defining a plurality of connection holes provided in first columns and second columns with each of the first and second columns arranged in a first direction of the flexible display; second wirings connected to the first wirings through the connection holes; gate lines and data lines intersecting each other within the active area; voltage applying lines parallel with the data lines; a thin film transistor provided for each sub-pixel and connected to the gate line and data line; an organic light emitting diode provided for each subpixel and respectively connected to the thin film transistor; a drive IC provided in the non-display area of the flexible base film; and a second flexible base film configured to cover the first flexible base film except for the drive IC, wherein, when the flexible base film is folded along a folding axis in a direction intersecting the first and second columns, the folding axis intersects at least one connection hole of the first and second columns.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 3B is a view illustrating the overlapping length of adjacent connection holes passing through the same horizontal line in FIG. 3A;

FIGS. 7A to 7C are views illustrating arrangement regions of connection holes of voltage applying lines in accordance with various embodiments of the present invention;

DETAILED DESCRIPTION OF THE ILLUSTRATED EMBODIMENTS

Reference will now be made in detail to the preferred embodiments of the present invention, examples of which are illustrated in the accompanying drawings. Wherever possible, the same reference numbers will be used throughout the drawings to refer to the same or like parts. In the following description of the present invention, a detailed description of known functions and configurations incorporated herein will be omitted when it may make the subject matter of the present invention rather unclear. Also, the names of elements used in the following description are defined in consideration of ease in preparation of the specification and may differ from the names of elements of an actual product.

Figure 1:
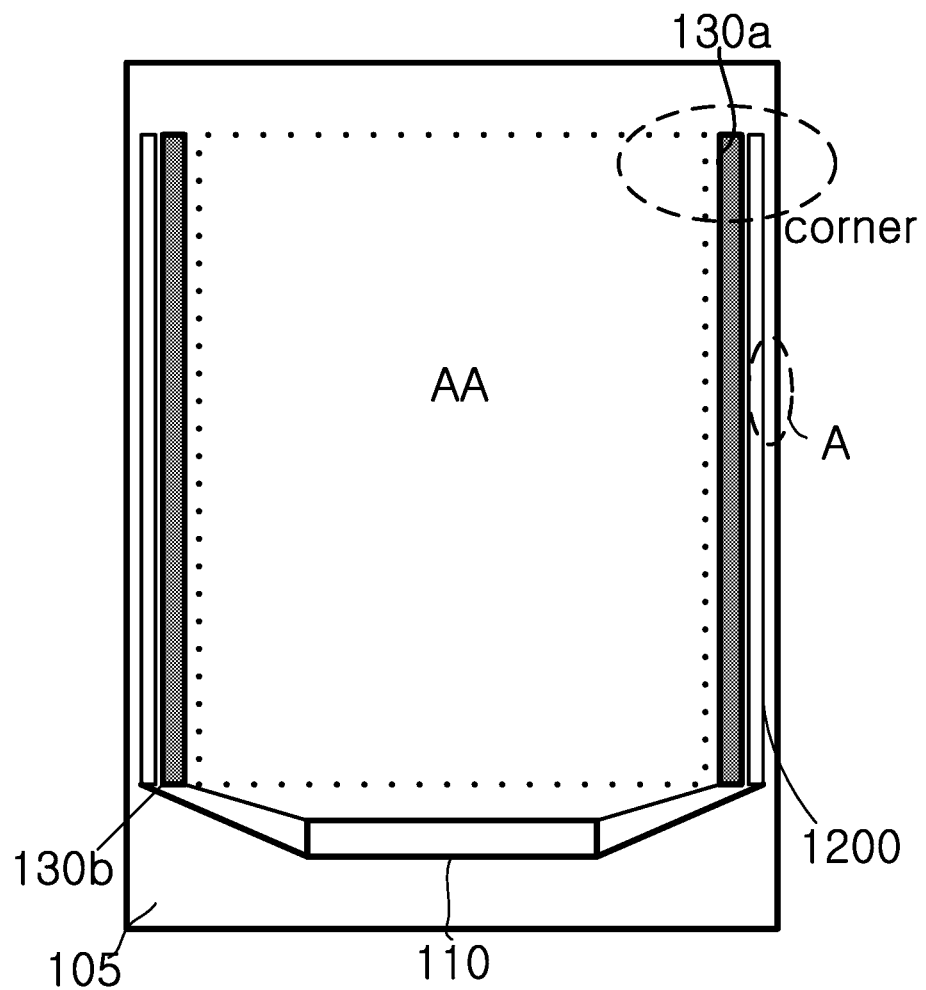
FIG. 1 is a plan view illustrating a backplane substrate in accordance with an example embodiment of the present invention.
Figure 2:
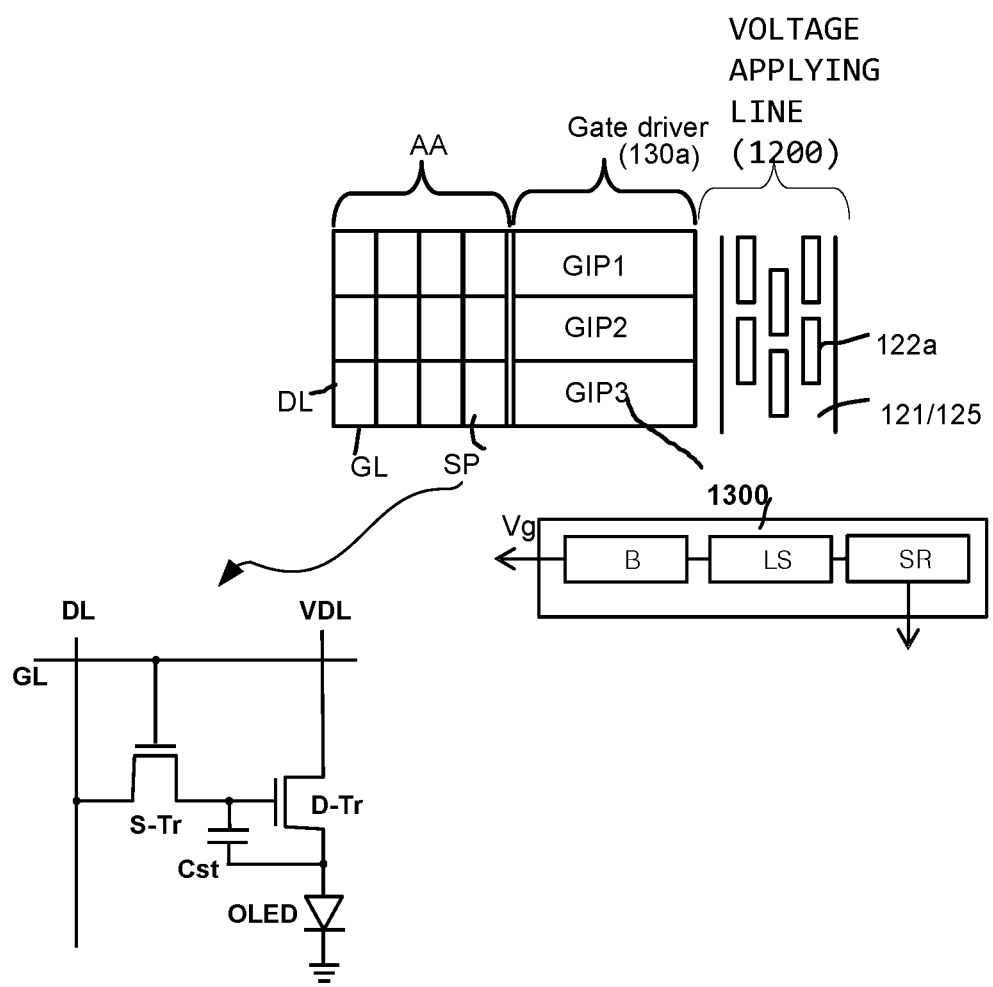
FIG. 2 is an enlarged plan view of a corner of FIG. 1.
Figure 3A:
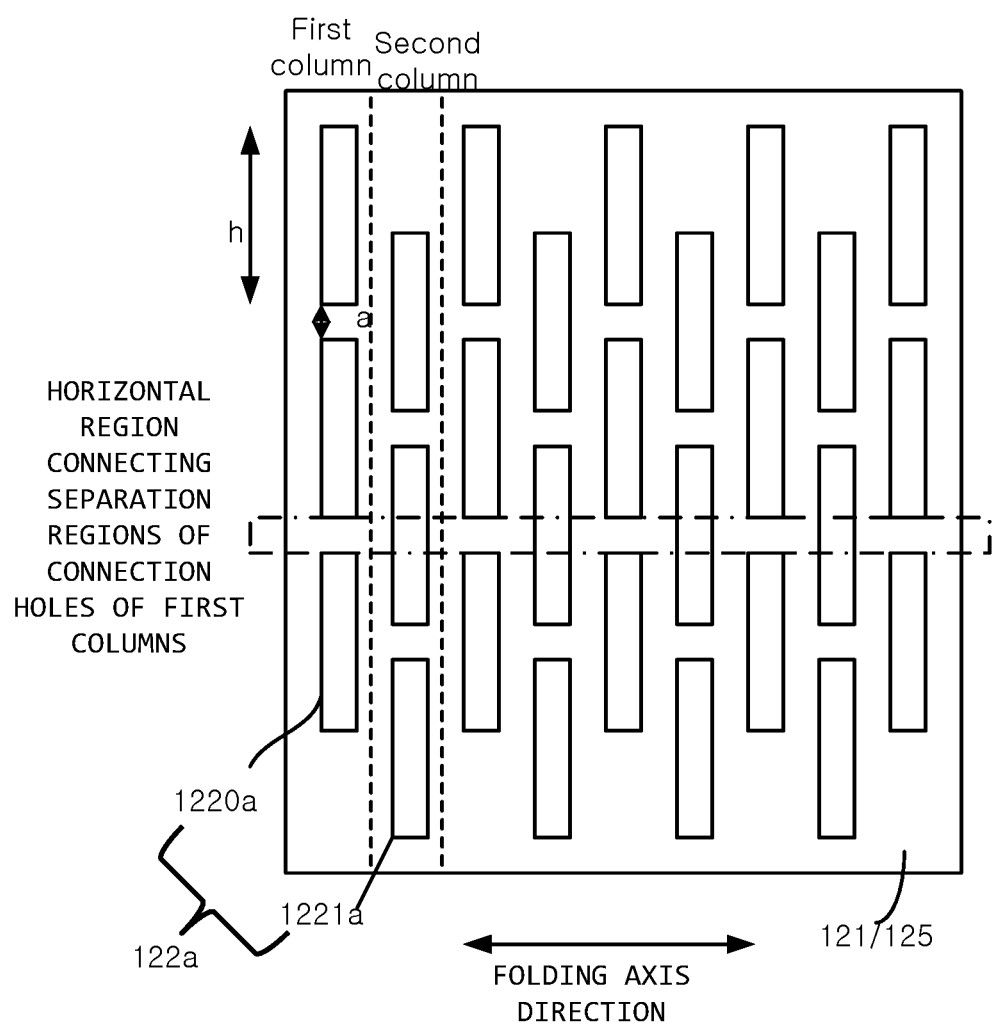
FIG. 3A is an enlarged view of a portion A of FIG. 1.

FIG. 1 is a plan view illustrating a backplane substrate in accordance with an example embodiment of the present invention, FIG. 2 is an enlarged plan view of a corner of FIG. 1, and FIG. 3A is an enlarged view of a portion A of FIG. 1.

As shown by example in FIGS. 1 to 3A, a backplane substrate 100 in accordance with an example embodiment of the present invention includes a flexible base film 105 having an active area AA with a plurality of sub-pixels SP provided in a matrix and a non-display area provided around the active area, first wirings 121 provided in the length direction of the flexible base film 105 in the non-display area of the flexible base film 105, and an interlayer insulating film 122 (shown in FIG. 5B) provided on the first wirings 121 and including a plurality of connection holes 122a provided in first columns and second columns in the length direction (i.e., the vertical direction in FIG. 1) of the flexible base film 105 so as not to be horizontal with each other.

Further, the backplane substrate 100 may include second wirings 125 connected to the first wirings 121 through the connection holes 122a. Overlapping and connection relations between the first wirings 121 and the second wirings 125 serve to stabilize a voltage signal applied through the first wirings 121. If applying of voltage to the outer regions is stable using only the first wirings 121, the second wirings 125 may be omitted. (See FIG. 9A.)

In the example shown in FIGS. 1 to 3A, the first wirings 121 and the second wirings 125 are connected through the connection holes 122a, thereby forming outer voltage applying lines 1200. In this example, the main shape of the outer voltage applying lines 1200 corresponds to the width of the first wirings 121. Even if the second wirings 125 are omitted, the connection holes 122a are provided, thereby preventing crack seeds, generated from the outer region, from being transmitted to the active area AA. Further, the second wirings 125 may have the same shape as the first wirings 121 or may be formed at only a part of the width of the first wirings 121.

Further, the length direction of the flexible base film 105 is the vertical direction in FIG. 1 and is the same as the direction of data lines provided in the active area AA.

In the active area AA, a plurality of gate lines GL and a plurality of data lines DL intersecting each other to divide the sub-pixels SP are disposed, pixel thin film transistors S-Tr are provided so as to execute a selective motion of the respective sub-pixels, and one or more thin film transistors or capacitors may be added according to types of light emitting units formed on the backplane substrate 100. For example, in the case of an organic light emitting method, each sub-pixel SP includes an organic light emitting diode and a driving thin film transistor D-Tr connected to the pixel thin film transistor S-Tr and supplying driving current to a first electrode of the organic light emitting diode. Further, the driving thin film transistor D-Tr receives power supply voltage from a power supply voltage line and a second electrode of the organic light emitting diode is connected to a ground voltage line.

Further, the first wirings 121 extend with a designated width of several tens of μm to hundreds of μm in the length direction of the flexible base film 105, and constant ground voltage GND or power supply voltage is applied to the first wirings 121. Since the first wirings 121 have a greater width than other clock lines disposed in the length direction, in order to stabilize a voltage signal, a plurality of connection holes may be provided on the first wirings 121 so as to execute connection between upper and lower layers.

The first wirings 121 are located at both sides of the active area AA. If the first wirings 121 are ground voltage lines, the width of the ground voltage lines is 550 μm to 2 mm and, if the first wirings 121 are power supply voltage lines, the width of the power supply voltage lines is smaller than that of the ground voltage lines, i.e., 30 μm or more, and thus, the number of the connection holes provided on the power supply voltage lines may be fewer than the number of the connection holes provided on the ground voltage lines. In any case, the width of the outer voltage applying lines 1200 including the first wirings 121 and the second wirings 125 is 30 μm to 2 mm, and such a width may allow connection holes to be sufficiently disposed in plural columns on the outer voltage applying lines 1200 and stabilize applied ground voltage or power supply voltage.

The backplane substrate 100 of an example embodiment of the present invention may have an arrangement of the connection holes 122a. The connection holes 122a are disposed on the first wirings 121 of the outer voltage applying lines 1200 located at positions close to the edge of the backplane substrate 100 so as to prevent growth of cracks generated from the edge of the backplane substrate 100. Further, if the first wirings 121 are ground voltage lines, the connection holes 122a may become ground connection holes and, if the first wirings 121 are power supply voltage lines, the connection holes 122a may become power supply voltage connection holes.

As shown by example in FIG. 3A, the plural connection holes 1221a in the second columns pass through the extension of a horizontal region corresponding to a separation distance "a" between the connection holes 1220a in the first columns and, thus, the connection holes 1220a and 1221a of the first and second columns are located on any line parallel with a folding axis direction. That is, at least one of the connection holes 1220a and 1221a of the first and second columns exists on any horizontal line in FIG. 3A.

Here, the connection holes 1220*a* and 1221*a* of the first and second columns are disposed so as to intersect the folding axis direction, and the folding axis direction is set as the horizontal direction in the figure. The reason why the connection holes 1220*a* and 1221*a* of the first and second columns are disposed so as to intersect the folding axis direction is that a crack may be transmitted in the folding axis direction through the insulating film between the first wirings 121 and the second wirings 125. That is, by providing at least one of the connection holes 1220*a* and 1221*a* of the first and second columns with respect to any line in the folding axis direction, a path of transmitting the crack is blocked.

In contrast, if the folding axis direction is the vertical direction, the connection holes 1220*a* and 1221*a* of the first and second columns intersecting the folding axis direction may be disposed in the horizontal direction. In this case, the outer voltage applying line 1200 may be located, for example, at the upper side of the flexible base film 105 as shown in FIG. 1, and connection holes extending in the horizontal direction at this region may be disposed in the horizontal direction intersecting the folding axis direction, i.e., the vertical direction. Even in this case, the connection holes of the second column may be located at a region corresponding to the separation distance "a" between the adjacent connection holes of the first column.

FIG. 3B is a view illustrating the overlapping length of adjacent connection holes 1220*a* and 1221*a* passing through the same horizontal line in FIG. 3A.

Further, as shown by example in FIG. 3B, the length h of each of the connection holes 122*a* of the first column and the second column is greater than the separation distance "a" between the adjacent connection holes 122*a* in the length direction and, thus, the upper and lower parts of the connection holes 1221*a* of the second column may vertically overlap the connection holes 1220*a* of the adjacent first column. Therefore, parts of the widths of the connection hole 1220*a* of the first column and the connection hole 1221*a* of the second column, which are adjacent to each other in the horizontal direction, may pass through the same horizontal line. That is, a portion of each of the connection holes of the first column overlap a portion of a respective one of the connection holes of the second column with respect to the folding axis direction. FIG. 3B illustrates that parts of the connection holes 1220*a* and 1221*a* of the odd-numbered line of the first columns and the even-numbered line of the second columns pass through the same horizontal line. The first column and the second column may be disposed one by one so as to be alternately disposed, as shown by example in FIG. 3B, or any one of the first column and the second column may be disposed in plural so as to be different in number.

The connection holes 122*a* have the same size as holes provided on the interlayer insulating film in the active area AA. The reason for this is to prevent an etching solution or plasma gas, used to form the connection holes 122*a* and the holes, from being concentrated upon a specific region.

Further, such arrangement of the connection holes 122*a* causes growth of a crack transmitted from the edge of the flexible base film 105 to the insulating film along the folding axis to be stopped at a member region of interlayer insulating film 122, i.e., the region of the connection holes 122*a*, thus preventing growth of a linear crack. Such a linear crack may influence not only the outer area but also the active area. The backplane substrate 100 of the present invention may prevent the linear crack from being transmitted to the active area through arrangement of the connection holes 122*a*, thus improving apparatus reliability. Particularly, growth of a crack at a region of the flexible base film 105, at which folding is carried out, is observed. The backplane substrate 100 in accordance with example embodiments of the present invention applies the above-described arrangement of the connection holes 122*a* to the folding region and thus the connection holes 122 distribute stress generated by folding.

The first wirings 121 are located at positions two-dimensionally close to the edge of the flexible base film 105. Further, as shown by example in FIG. 1, two-dimensionally, gate drivers 130*a* and 130*b* are positioned between the first wirings 121 and the active area AA. The gate drivers 130*a*, 130*b* are directly formed on the flexible base film 105 in the non-display area while forming the thin film transistors (TFT) in active area AA. Further, a part of each of the gate drivers 130*a* and 130*b* may be electrically connected to the first wiring 121 horizontally. In this case, the gate drivers 130*a* and 130*b* may also have a function of distributing stress during folding inside the outer voltage applying lines 1200 by contact holes of source electrodes and drain electrodes provided therein.

The gate drivers 130*a* and 130*b* directly on the flexible base film 105 are a type of Gate In Panel (GIP), and circuits corresponding to the gate drivers 130*a* and 130*b* are formed through the same process as the thin film transistors TFT formed in the active area AA. A plurality of gate circuit blocks 1300 corresponding to the gate lines GL is formed on the gate lines GL, and each of the gate circuit blocks 130 may includes a shift register SR, a level shifter LS and a buffer B.

Hereinafter, operation of the gate circuit block 1300 will be described as follows.

First, the shift registers SR in the respective gate circuit blocks 1300 sequentially shift a logic high signal at intervals of on-time of one line. Further, the level shifter LS converts gate high voltage and gate low voltage supplied from the voltage signal line into on/off voltage of the gate line according to the output logic level of the shift register SR. Further, the buffer B has a function of amplifying current in consideration of the load of the gate line and transmits a gate on voltage to the gate line.

Reference numeral 110 in FIG. 1 represents a drive IC. A part of the outer area of the flexible base film 105 corresponding to one side has a relatively long width, and the drive IC 110 is provided at such a part. The drive IC 110 functionally includes a data driver to transmit an image signal to the data line DL, and a timing controller to generate and transmit clock signals of the gate drivers 130*a* and 130*b* and the data driver as well as to transmit a voltage signal.

The first wirings 121, the gate drivers 130*a* and 130*b* and clock signal lines (not shown) are disposed in the length direction of the non-display area and connected to the drive IC 110. The clock signal lines may pass by the gate drivers 130 and 130*b*. Further, the first wirings 121 are lines to which the above-described ground voltage and power supply voltage is applied, and may be, for example, lines relating to driving of the gate lines, such as a gate high voltage, a gate low voltage, a ground voltage, etc., or lines relating to driving of organic light emitting diodes. In common, constant voltage signals are applied to these lines.

Further, the first wirings 121 and the second wirings 125, such as the clock signal lines and the voltage signal lines, may be formed through the same process using the same metal as the gate lines GL or the same metal as the data lines DL.

The inner circuit provided in the sub-pixel SP of FIG. 2 is a circuit when the backplane substrate is used in an organic light emitting display device, and represents a circuit unit including the pixel thin film transistor S-Tr, the driving thin film transistor D-Tr, the storage capacitor Cst and the organic light emitting diode OLED connected to the storage capacitor Cst and the driving thin film transistor D-Tr, in each sub-pixel of the active are AA. Any thin film transistor may be further added, as needed, the driving thin film transistor D-Tr is electrically connected to the first electrode of the organic light emitting diode OLED, and the storage capacitor Cst is connected between the gate electrode of the driving thin film transistor D-Tr and a connection terminal of the driving thin film transistor D-Tr connected to the first electrode of the organic light emitting diode OLED. The connection terminal may be a source electrode or a drain electrode of the driving thin film transistor D-Tr and, if the drain electrode is used as the connection terminal, the source electrode is connected to a power supply voltage line VDL and receives driving voltage. If the source electrode is used as the connection terminal, the drain electrode is connected to the power supply voltage line VDL.

Further, the circuit unit is provided between the gate line GL and the data line DL intersecting each other and located at the boundary between the sub-pixels SP. The power supply voltage line VDL is parallel with the data line DL and is separated from the data line DL of the adjacent sub-pixel. The pixel thin film transistor S-Tr is provided between the gate line GL and the data line DL and connected to the gate electrode of the driving thin film transistor D-Tr connected to the storage capacitor Cst, and the designated sub-pixel transmits current to the organic light emitting diode OLED through the driving thin film transistor D-Tr according to selective driving of the pixel thin film transistor S-Tr and thus adjusts on/off of the organic light emitting diode OLED.

The outer voltage applying lines 1200 are parallel with the data lines DL and may include the power supply voltage line VDL and the ground voltage line Vss. Further, the first wirings 121 may be located on the same layer as the gate lines GL, and the second wirings 125 may be located on the same layer as the data lines DL or the power supply voltage line VDL/ground voltage line Vss and electrically connected to the power supply voltage line VDL or the ground voltage line Vss.

Further, the first wirings 121 and the second wirings 125 may two-dimensionally overlap each other. Further, the first wirings 121 and the second wirings 125 may overlap each other by a designated width.

Further, a thin film transistor of the gate circuit block is formed in the same or similar shape as or to the selected thin film transistor or the driving thin film transistor. Here, the selected thin film transistor corresponds to configuration of the above-described pixel thin film transistor.

As the base film of the backplane substrate 100, the flexible base film 105 is a flexible plastic film and may include one or more polymers selected from the group consisting of polyester and a copolymer including polyester, polyimide and a copolymer including polyimide, an olefin-based copolymer, polyacrylic acid and a copolymer including polyacrylic acid, polystyrene and a copolymer including polystyrene, polysulfate and a copolymer including polysulfate, polycarbonate and a copolymer including polycarbonate, polyamic acid and a copolymer including polyamic acid, polyamine and a copolymer including polyamine, polyvinyl alcohol and polyallyamine. Here, the thickness of the flexible base film 105 may be 5 μm to 150 μm, and be more particularly 50 μm or less. Further, in order to prevent problems, such as rolling of the flexible base film 105 or damage to the flexible base film 105 by heat or pressure when an array process is carried out directly on the flexible base film 105, the flexible base film 105 may be formed on a glass substrate, a buffer layer 153 (with reference to FIG. 7) may be provided on the surface of the flexible base film 105 and then an array may be formed thereon. In this case, the glass substrate used during such a process is removed after the array formation process and the flexible base film 105 may remain on the entire outer surface of the backplane substrate 100.

Hereinafter, in the backplane substrate in accordance with example embodiments of the present invention, the reason why, among the connection holes disposed on the first wirings, the connection holes of the first columns and the connection holes of the second columns are disposed in different regions will be described.

Figure 4A:
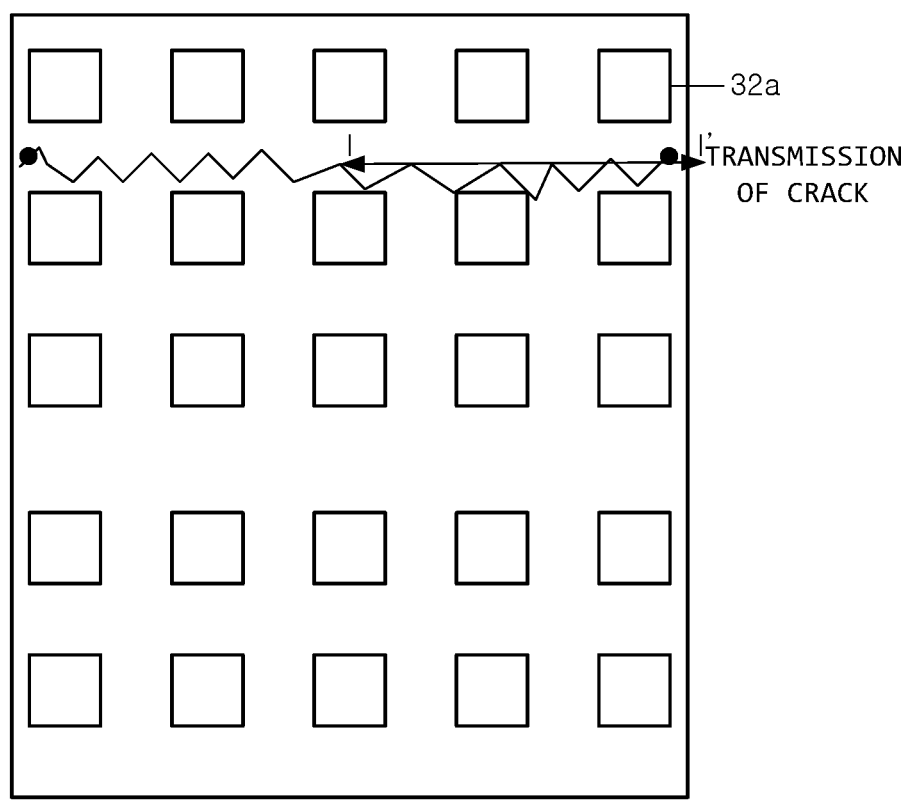
FIGS. 4A and 4B are plan views illustrating arrangement of adjacent connection holes in the same line and arrangement of adjacent connection holes in different lines.
Figure 4B:
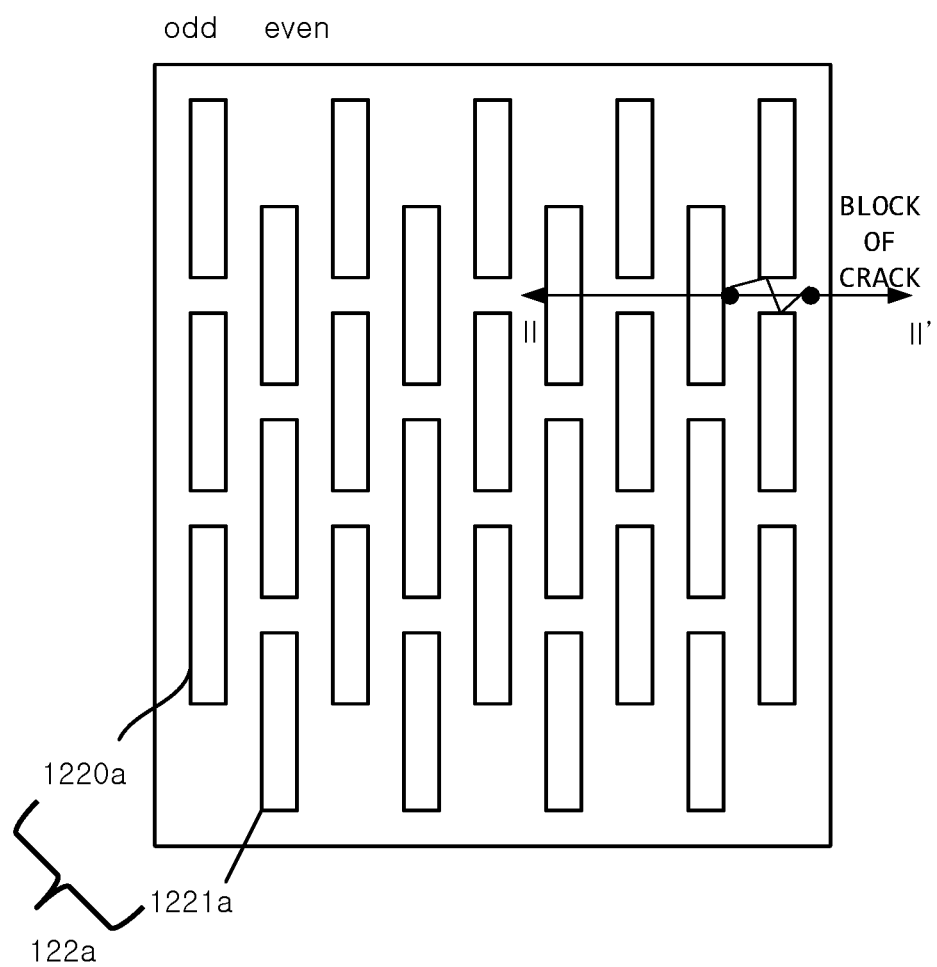
Figure 5A:
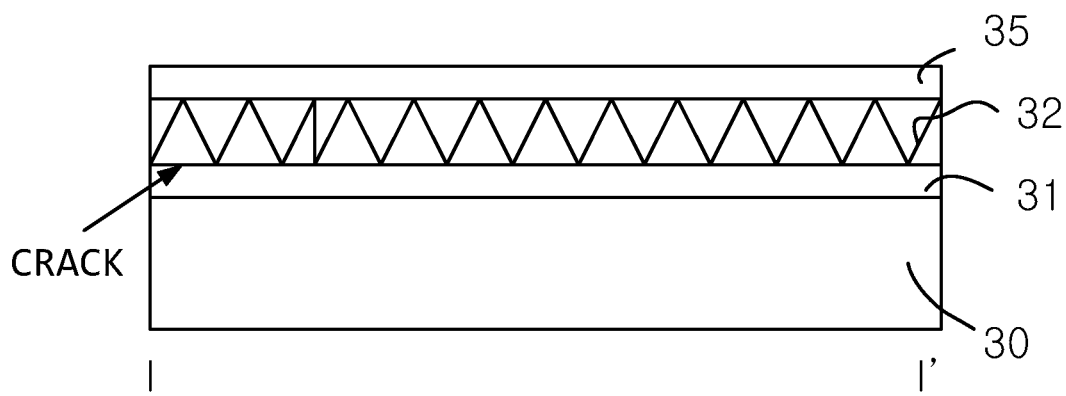
FIGS. 5A and 5B are cross-sectional views of FIGS. 4A and 4B illustrating crack paths.
Figure 5B:
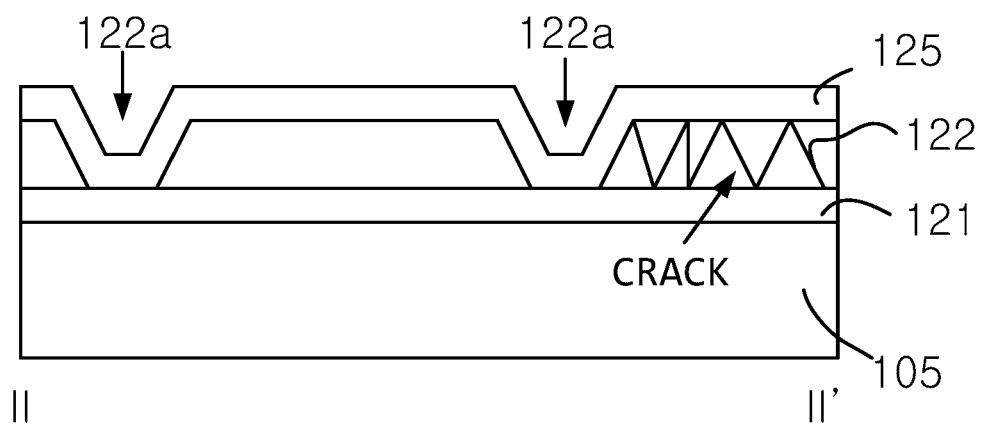

FIGS. 4A and 4B are plan views illustrating arrangement of adjacent connection holes in the same line and arrangement of adjacent connection holes in different lines and FIGS. 5A and 5B are cross-sectional views of FIGS. 4A and 4B illustrating crack paths.

FIGS. 4A and 5A illustrates an example where connection holes 32a are arranged in parallel in a horizontal line on first wiring 31 and the first wiring 31 is connected to second wiring 35 by a plurality of connection holes 32a. In such an arrangement, a horizontally extending region having a designated width in which no connection holes 32 are disposed is generated and, if a crack is generated from the edge of the region with no connection holes 32, the crack may be transmitted to an interlayer insulating film 32 along a horizontal line and directly influence the active area. In this case, a linear crack in the active area may be observed and lighting fault on a line or malfunction may be generated and cause a defect.

On the other hand, in the backplane substrate in accordance with an example embodiment of the present invention, as exemplarily shown in FIGS. 4B and 5B, the connection holes 122 (1220a and 1221a) are vertically extended, and the connection holes 1220a of the first columns and the connection holes 1221a of the second columns form vertical overlapping regions at the upper and lower edges and thus cut off a part through which a crack passes. In an actual example flexible display, folding is mainly carried out in the horizontal direction using a horizontal line as a folding axis, and a folding region receiving stress generated due to such folding may be set in proportion to curvature R of a folding motion. Further, the folding region continuously receives stress generated due to folding, as compared to other flat regions.

In the backplane substrate, the connection holes 1220a of the first columns and the connection holes 1221a of the second columns on the first wiring 121 located at a position close to the edge are disposed so as not to be parallel with each other and, thus, one or more connection holes 122a may be disposed in any line in the folding axis direction, thereby preventing growth of a crack.

That is, the connection holes 122a are located on the interlayer insulating film 122 located between the first and second wirings 121 and 125 connected to each other through the connection holes 122a, and prevent growth of a crack seed mainly transmitted along the interlayer insulating film 122. In this case, the connection holes 122a exert a function of distributing stress transmitted along the folding axis.

Although the connection holes 122a of the first and second columns are described as having the same shape, the disclosure is not limited thereto. Even if the connection holes 1220a of the first columns and the connection holes 1221a of the second columns have different shapes, the vertical length of each connection hole 122a is greater than the horizontal length of each connection hole 122a so that the connection holes 1220a of the first columns and the connection holes 1221a of the second columns have an overlapping width in the vertical direction, and the length "h" of the connection holes 1221a of the second columns is greater than the separation distance a between the connection holes 1220a of the first columns. Therefore, a crack transmitted along the separation distance between the connection holes 1220a of an odd-numbered line may be blocked by the connection holes 1221a of an even-numbered line.

Figure 6:
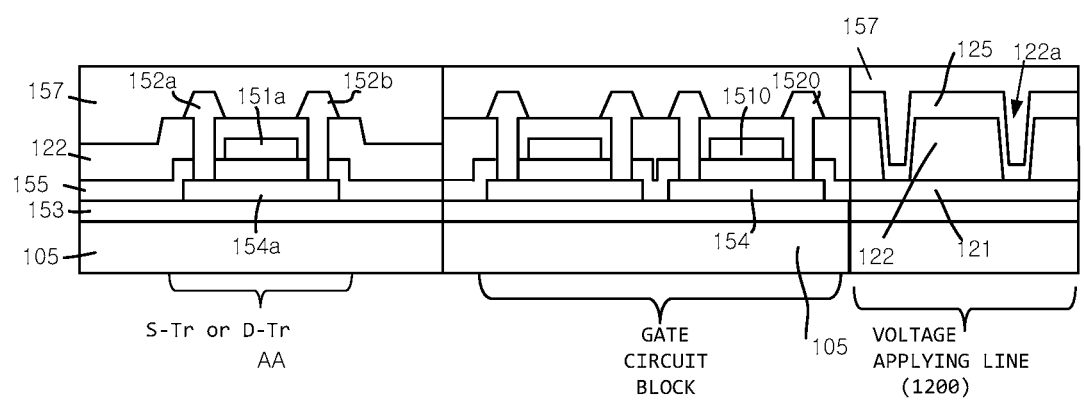
FIG. 6 is a cross-sectional view illustrating an active area, a GIP area and a voltage applying line area.

FIG. 6 is a cross-sectional view illustrating the active area, a GIP area and a ground line hole area.

As shown by example in FIG. 6, each pixel thin film transistor S-Tr of the active area of the backplane substrate, for example, includes an island-shaped active layer 154a formed at a designated region on the buffer layer 153, a gate electrode 151a located on the active layer 154a, and a source electrode 152a and a drain electrode 152b connected to both ends of the active layer 154a.

The active layer 154a may be any one of an amorphous silicon layer, a crystalline silicon layer and an oxide semiconductor layer. Further, both ends of the active layer 154a may be doped with impurities so as to be connected to the source electrode 152a and the drain electrode 152b.

Further, the layer positions of the active layer 154a, the gate electrode 151a and the source/drain electrodes 152a and 152b may be interchanged, as needed. The gate electrode 151a is formed integrally with the gate line 151 or connected to the gate line 151, and the source electrode 152a functions as a pixel thin film transistor in a sub-pixel if the source electrode 152a is connected to the data line 152 or formed integrally with the data line 152. In addition to the pixel thin film transistor, other thin film transistors may be provided in the sub-pixel according to display methods. If a plurality of thin film transistors is provided, connection relations between the gate and source electrodes of each thin film transistor and the lines (the gate line and the data line) may differ from the above-described connection relations.

A gate insulating film 155 is interposed between the active layer 154a and the gate electrode 151a, the interlayer insulating film 122 is interposed between the gate electrode 151a and the source/drain electrodes 152a and 152b, and a protective film 157 is formed on the interlayer insulating film 122.

A plurality of thin film transistors having the same or similar shape as or to the pixel thin film transistor is provided on each gate circuit block 1300 at the gate drivers 130a and 130b of FIG. 1, i.e., the GIP regions. That is, the functions of the shift register, the level shifter and the buffer may be substituted by disposition of the thin film transistors.

Here, as shown by example in FIG. 6, the first wiring 121 is located on the same layer as the gate line GL or the gate electrode 151a, and the second wiring 125 is located on the same layer as the data line DL or the source electrode 152a and the drain electrode 152b.

The interlayer insulating film 122 is disposed between the first wiring 121 and the second wiring 125, and the second wiring 125 is connected to the first wiring 121 located below the second wiring 125 through the connection holes 122a provided on the interlayer insulating film 122. Further, the backplane substrate 100 may further include the protective film 157 to protect the surfaces of both the active area and the non-display area.

Hereinafter, non-parallel arrangements of connection holes in accordance with various embodiments through various types of bending or folding of the flexible display of example embodiments of the present invention will be described.

Figure 7C:
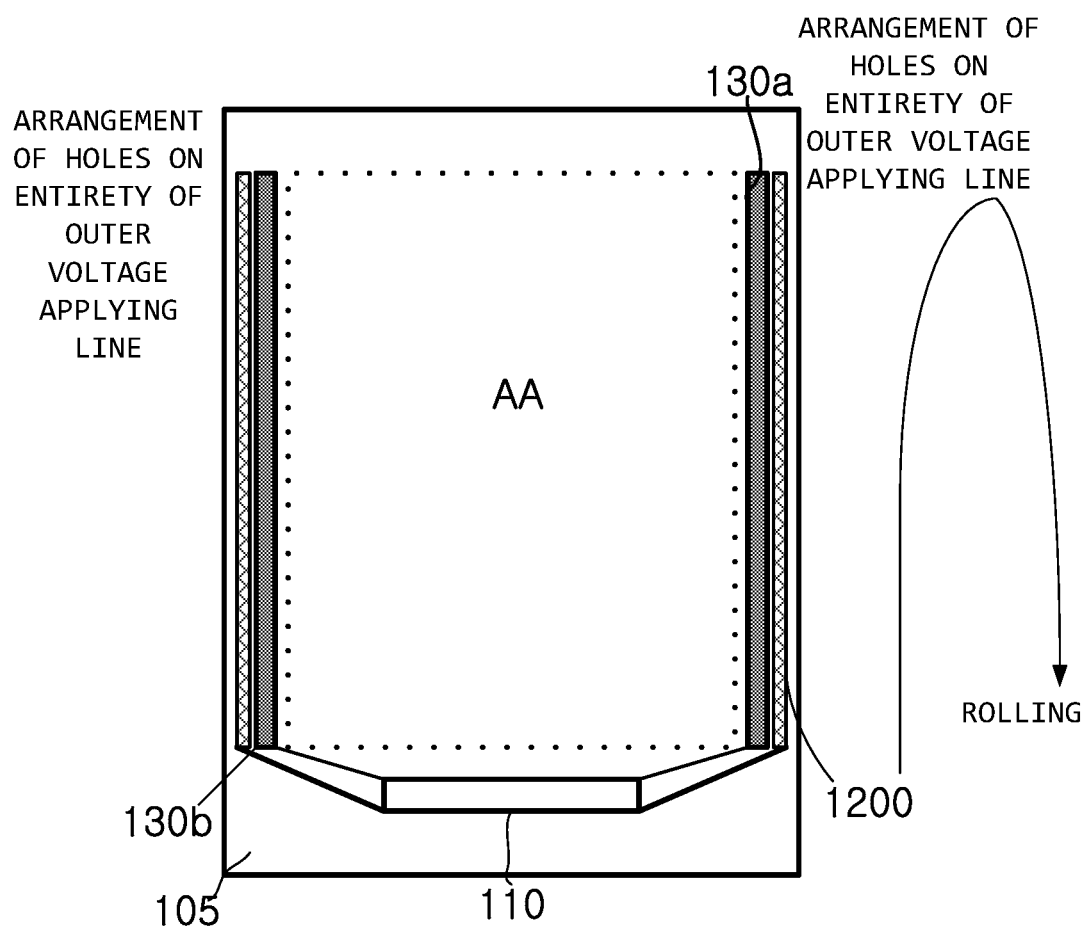

FIGS. 7A to 7C are views illustrating arrangement regions of connection holes of voltage applying lines in accordance with various example embodiments of the present invention.

FIG. 7A illustrates a flexible display, the upper part of which is bent. In this case, the connection holes of the outer voltage applying line having the shape shown in FIG. 3 are arranged at a bending region corresponding to a bending line and a partial width around the bending line. Here, the bending region may become a folding region and include ten or fewer sub-pixels disposed vertically, and the folding axis direction of the bending region is parallel with gate lines. Further, the connection holes may be selectively arranged at the outer voltage applying lines 1200 located at both edges of the bending region.

FIG. 7B illustrates a flexible display which is vertically folded in half. In this case, the connection holes of the outer voltage applying line having the shape shown in FIG. 3 are arranged at a folding region corresponding to a folding line and a partial width around the folding line. Here, the connection holes may be selectively arranged at the outer voltage applying lines 1200 located at both edges of the folding region.

FIG. 7C illustrates a kind of rollable display in which a folding axis is disposed in the same direction as gate lines and a flexible base film 105 is foldable. Here, the connection holes of the outer voltage applying line having the shape shown in FIG. 3 are arranged at all regions of first wirings forming the outer voltage applying lines 1200 provided at both edges.

Figure 8A:
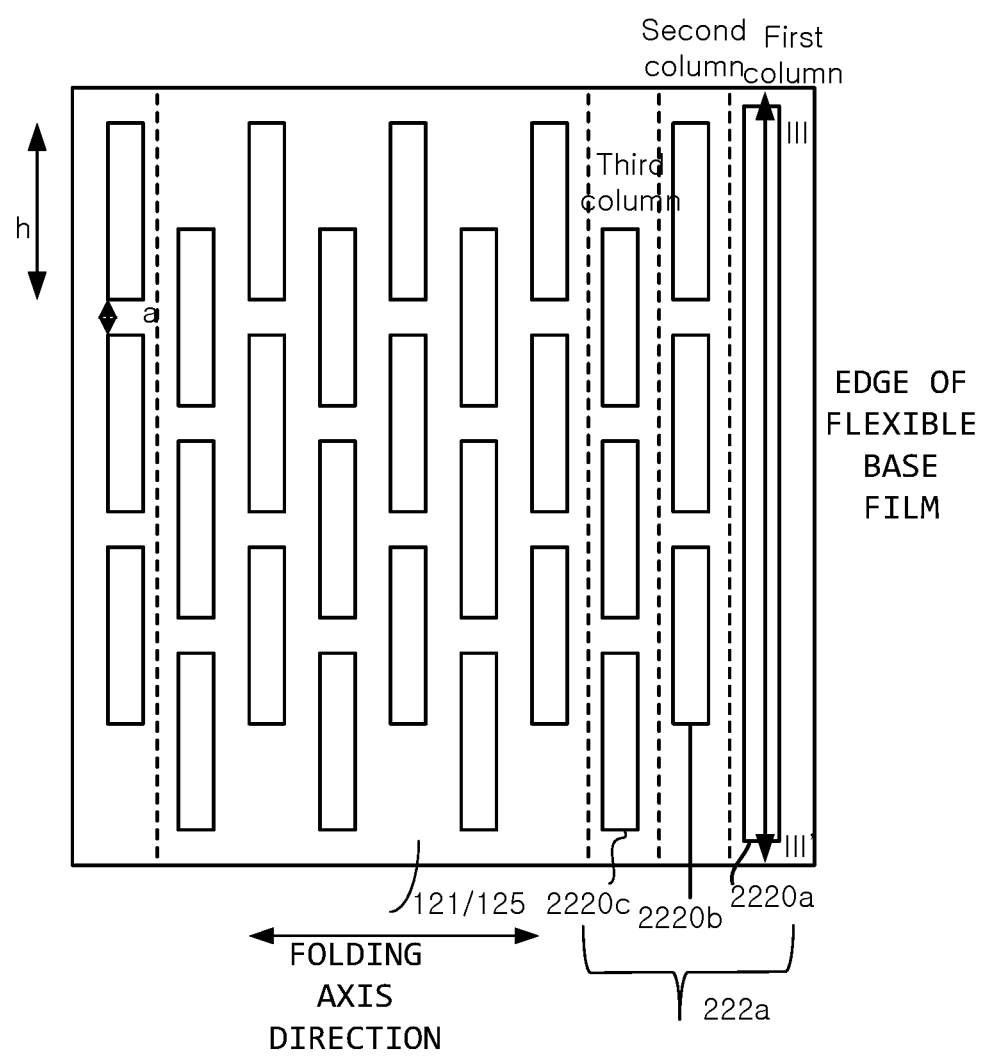
FIGS. 8A and 8B are plan and cross-sectional views illustrating the shape of a connection hole of an outer voltage applying line of the backplane substrate in accordance with another embodiment of the present invention.
Figure 8B:
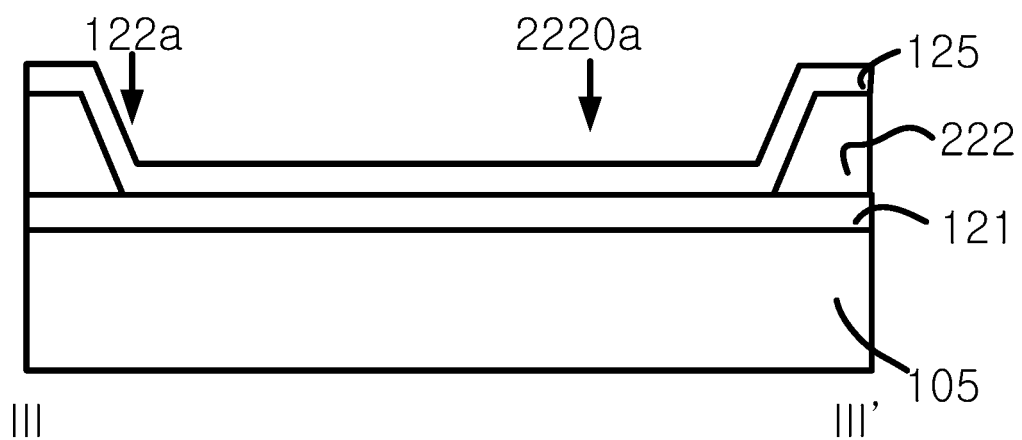

FIGS. 8A and 8B are plan and cross-sectional views illustrating the shape of a connection hole of the outer voltage applying line of the backplane substrate in accordance with another example embodiment of the present invention.

As shown by example in FIGS. 8A and 8B, a connection hole arranged at the outer voltage applying line, particularly, a connection hole 2220a of a first column most adjacent to the edge of a first flexible base film extends in a direction intersecting the folding axis direction, thereby preventing transmission of a crack at a region corresponding to the connection hole 2220a of the first column.

In this case, a plurality of connection holes 2220b, separated from each other in the column direction and of a second column adjacent to the first column, and a plurality of connection holes 2220c of a third column adjacent to the second column may be further arranged. The connection holes 2220b and 2220c of the second and third columns are arranged so as to compensate for the separation regions of the respective columns.

In such a structure, the reason why one connection hole 2220a of the first column most adjacent to the edge region extends to a long length is to remove a portion of the interlayer insulating film 222, which is susceptible to crack transmission through arrangement of the connection hole 2220a of the first column. As a result, a crack transmitted from the edge may be primarily blocked by the connection hole 2220a of the first column.

However, the length of the connection hole 2220a of the first column is not completely the same as the length of the first wirings 121. Since the connection holes 222a (2220a, 2220b and 2220c) are patterned together through a process of patterning the interlayer insulating film 222 of the active area and thus defined, if the connection hole 2220a having a long length is arranged at a specific region, an etchant and plasma gas used to form the connection holes 222a and to execute patterning may be concentrated upon a region having a large opening and damage such a region. Therefore, the length of the connection hole 2220a of the first column is restricted to the length of a local region of the outer voltage applying line 1200.

Figure 9A:
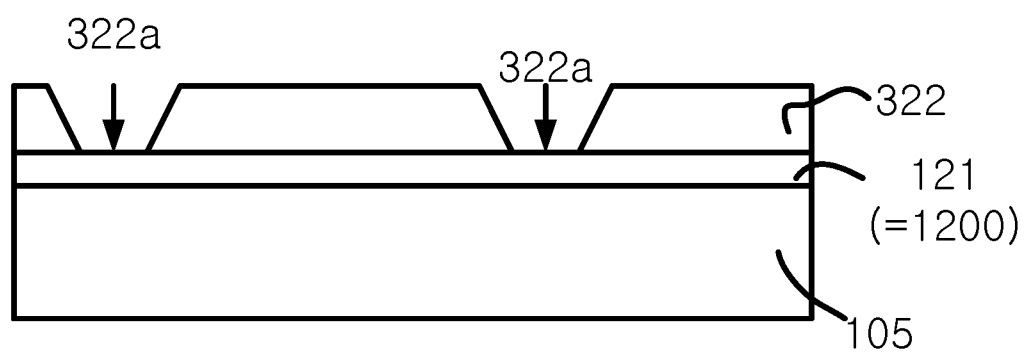
FIGS. 9A and 9B are cross-sectional views illustrating modifications of connection holes of an outer voltage applying line of FIG. 6.
Figure 9B:
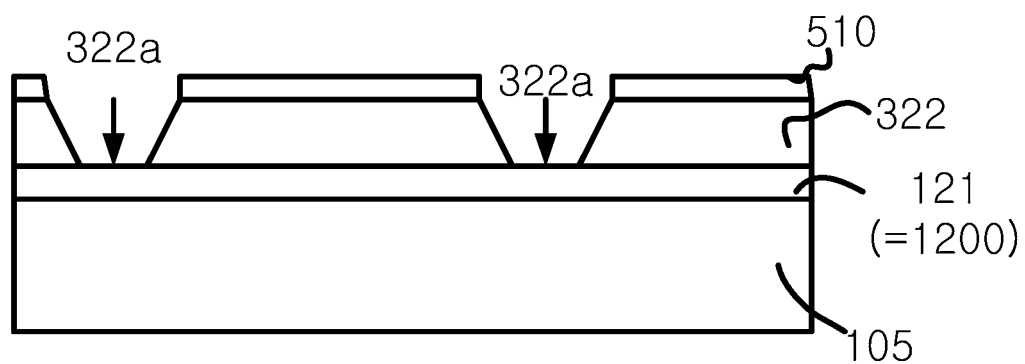

FIGS. 9A and 9B are cross-sectional views illustrating modifications of the connection holes of the outer voltage applying line of FIG. 6.

FIG. 9A illustrates a modification in which an outer voltage applying line 1200 is defined only by first wiring 121. Even in this case, the connection holes 222a have the shape of FIG. 3A and cut a crack transmission path. Here, the connection holes 222a may be formed on an interlayer insulating film 322 located between gate lines GL and data lines DL.

Further, as shown by example in FIG. 9B, an insulating film 510, such as a protective film or other interlayer insulating films, may be provided on an interlayer insulating film 322 having connection holes 322a, and the insulating film 510 may have the same holes as the connection holes 322a. Here, as other interlayer insulating films, an inorganic film of a laminate, in which an organic film and the inorganic film are alternately stacked, for encapsulating an organic light emitting diode array formed on the backplane substrate may be used. In this case, the interlayer insulating film 322 having the connection holes 322a and the insulating film 510 may be inorganic films. An inorganic film has relative frangibility and is susceptible to cracks and thus (connection) holes are formed on the inorganic film so as to assure a member region. But an organic film has a low crack transfer property and, thus, does not require formation of (connection) holes.

Figure 10:
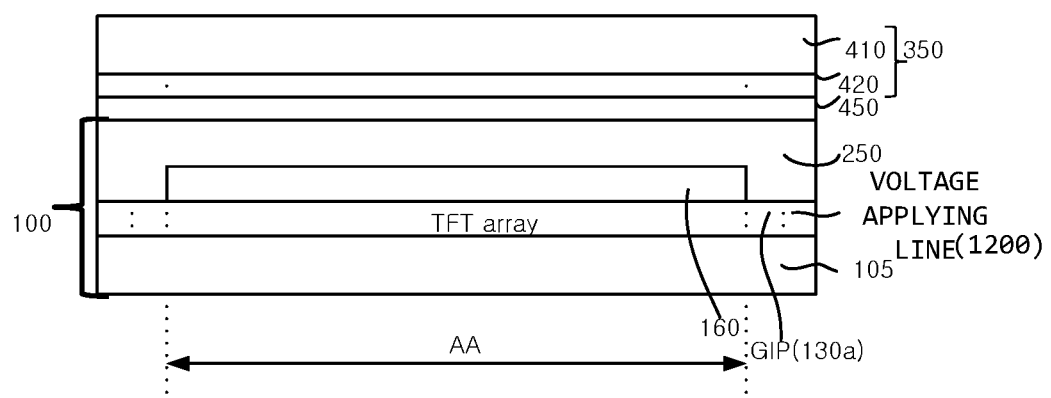
FIG. 10 is a cross-sectional view illustrating a flexible display in accordance with an example embodiment of the present invention.
Figure 11:
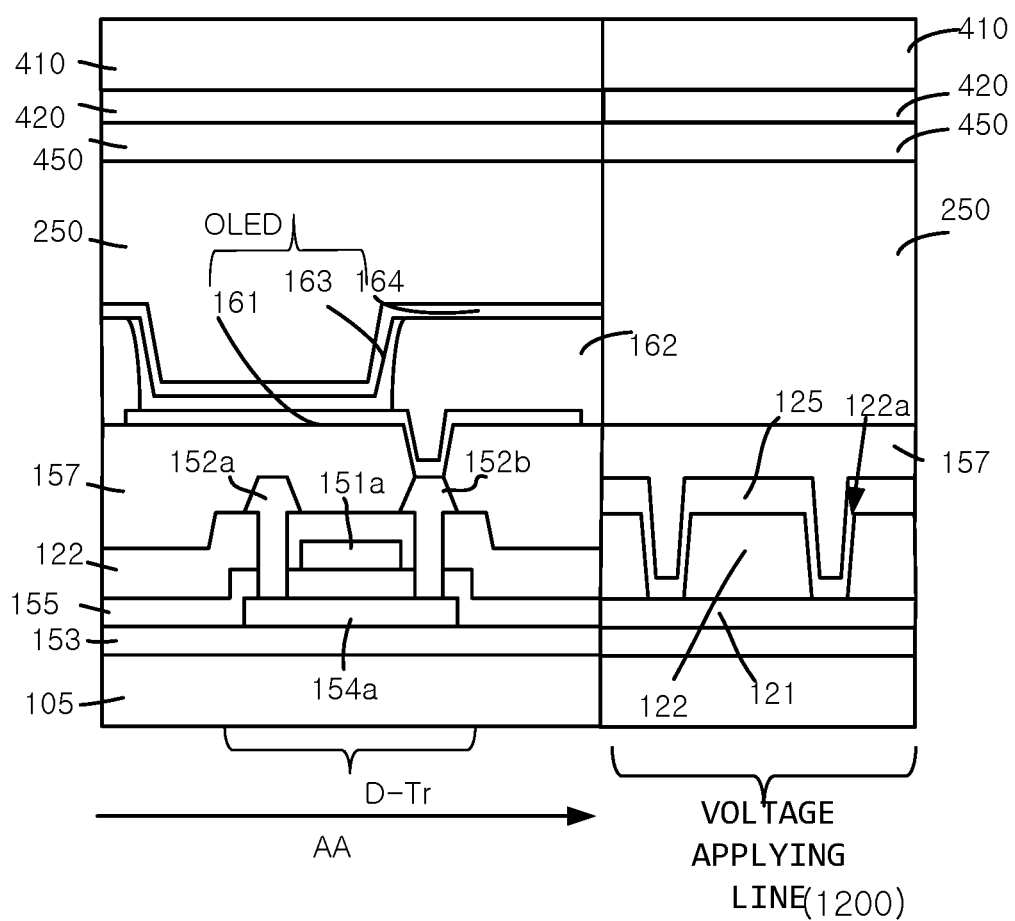
FIG. 11 is a cross-sectional view illustrating an active area and connection hole parts of FIG. 9 in detail.

FIG. 10 is a cross-sectional view illustrating a flexible display in accordance with an example embodiment of the present invention, and FIG. 11 is a cross-sectional view illustrating an active area and connection hole parts of FIG. 9 in detail.

A flexible display in accordance with an example embodiment of the present invention includes a circuit configuration shown in FIG. 2 in each sub-pixel of an active area, and includes, as shown by example in FIGS. 1 to 3A, gate drivers 130a and 130b provided in a non-display area of a first flexible base film 105 and outer voltage applying lines 1200 including first wirings 121 and second wirings 125 overlapping each other and formed outside the gate drivers 130a and 130b in the non-display area so as to be close to the edge of the first flexible base film 105 and connection holes 122a of a plurality of first columns and second columns provided between the first wirings 121 and the second wirings 125 to connect the first wirings 121 and the second wirings 125. Further, the connection holes 122a of the first columns and the connection holes 122a of the second columns are non-parallel with each other, as described above.

The flexible display differs from the above-described backplane substrate 100 in that the flexible display further includes a second flexible base film 410 to expose a driver IC 110, a touch unit 350 having a touch electrode array 420 provided on the inner surface of the second flexible base film 410, and a bonding layer 450 provided between the touch unit 350 and the backplane substrate 100.

FIG. 10 illustrates the layer structure of the flexible display. The backplane substrate 100 includes a TFT array and an organic light emitting array 160 on the TFT array, in the active area AA on the flexible base film 105, and the gate drivers 130a and 130b and the outer voltage applying lines 1200 are disposed in the non-display area so as to be coplanar with the TFT array.

Further, to protect the organic light emitting array 160 from external moisture or air, the organic light emitting array 160 is encapsulated with a barrier laminate 250, in which an organic film and an inorganic film are alternately stacked, such that the upper and side parts of the organic light emitting array 160 are covered with the barrier laminate 250.

The touch electrode array 420 corresponds to the active area and the non-display area may further include routing wiring that is coplanar with the touch electrode array 420.

As shown by example in FIG. 11, the organic light emitting array 160 includes an organic light emitting diode OLED corresponding to each sub-pixel, and the organic light emitting diode OLED includes a first electrode 161 connected to a driving thin film transistor D-Tr, an organic light emitting layer 163 provided on the first electrode 161 and a second electrode 164 provided on the organic light emitting layer 163. Here, the organic light emitting layer 163 is formed within a light emitting region defined by a bank 162 provided at the boundary between the respective sub-pixels.

The second wiring 125 of the outer voltage applying line 1200 is electrically connected to the first electrode 161 or the second electrode 164 and, thus, a signal of the same kind as a signal applied to the first electrode 161 or the second electrode 164 may be applied to the second wiring 125. That is, constant phase voltage or ground voltage is transmitted to the outer voltage applying line 1200, and the first and second wirings 121 and 125 are connected to each other by overlapping the first and second wirings 121 and 125 and providing the connection holes 122a between the first and second wirings 121 and 125.

That is, the flexible display according to example embodiments of the present invention includes at least one connection hole 122a with respect to any (horizontal) line provided along the folding axis, in the folding region, thereby preventing growth of a crack seed. That is, even if a crack is generated at any region, the crack meets the connection holes 122a and may be stopped. Particularly, although a folding motion is repeated several times, separation between regions is executed and, thus, growth of a crack along a line may be prevented due to stress distribution effects. Therefore, apparatus reliability may be assured.

As apparent from the above description, a backplane substrate and a flexible display using the same in accordance with example embodiments of the present invention have effects, as follows.

As a base film applied to the flexible display, a flexible base film may be used to achieve flexibility and a slim structure. A crack seed may be generated from the edge of such a flexible base film after scribing. The backplane substrate and the flexible display using the same may include at least one connection hole with respect to any line provided along the folding axis, in the folding region, thus preventing growth of such a crack seed. That is, when the crack seed meets the connection holes, growth of the crack seed may be stopped. As a result, although a folding motion is repeated several times, separation between regions is executed and, thus, growth of a crack along a line may be prevented due to stress distribution effects. Therefore, apparatus reliability may be assured.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A backplane substrate, comprising:
a flexible base film having an active area with a plurality of sub-pixels and a non-display area around the active area; and
an interlayer insulating film on the flexible base film and including a plurality of connection holes provided in first columns and second columns with each of the first and second columns arranged in a first direction of the flexible base film,
wherein, when the flexible base film is folded along a folding axis in a direction intersecting the first and second columns, the folding axis intersects at least one connection hole of the first and second columns.

2. The backplane substrate according to claim 1, further comprising first wirings on the non-display area of the flexible base film covered by the interlayer insulating film.

3. The backplane substrate according to claim 2, wherein the first wirings are provided in the first direction of the flexible base film.

4. The backplane substrate according to claim 2, further comprising second wirings connected to the first wirings through the connection holes.

5. The backplane substrate according to claim 1, wherein a direction of the folding axis is substantially perpendicular to the first direction.

6. The backplane substrate according to claim 5, wherein one of the connection holes of the second columns is present in the direction of the folding axis to a region between adjacent ones of the connections holes of the first columns.

7. The backplane substrate according to claim 6, wherein each of the connection holes in the first columns and the second columns has a length in the first direction that is greater than a width in a direction perpendicular to the first direction, and
wherein the length of each of the connection holes in the first columns and the second columns is greater than a separation distance between adjacent ones of the connection holes in a same column.

8. The backplane substrate according to claim 7, wherein a portion of each of the connection holes of the first column overlaps a portion of a respective one of the connection holes of the second column with respect to the direction of the folding axis.

9. The backplane substrate according to claim 2, wherein the width of the first wirings is 30 μm to 2 mm.

10. The backplane substrate according to claim 2, wherein the active area includes a plurality of gate lines and a plurality of data lines intersecting each other to define the plurality of subpixels in a matrix, and wherein the active layer further includes voltage applying lines parallel with the data lines.

11. The backplane substrate according to claim 10, wherein the first wirings are located on the same layer as the gate lines and the second wirings are located on the same layer as the voltage applying lines.

12. The backplane substrate according to claim 11, wherein the voltage applying lines include power supply voltage lines and ground voltage lines.

13. The backplane substrate according to claim 4, wherein the first wirings and the second wirings overlap each other.

14. The backplane substrate according to claim 13, wherein the second wirings are connected to the power supply voltage lines and the ground voltage lines.

15. The backplane substrate according to claim 13, further comprising gate drivers directly on the flexible base film between the first wirings and the active area.

16. The backplane substrate according to claim 1, wherein in the first direction, the connection holes in the first columns do not overlap with the connection holes in the second columns.

17. The backplane substrate according to claim 1, wherein the first and second columns are in the non-display area.

18. The backplane substrate according to claim 1, further comprising:
gate drivers on the flexible base film between the first wirings and the active area.

19. A flexible display, comprising:
a flexible base film having an active area with a plurality of sub-pixels provided in a matrix and a non-display area around the active area;
first wirings on the non-display area of the flexible base film;
an interlayer insulating film provided on the flexible base film covering the first wirings, the interlayer insulating film defining a plurality of connection holes provided in first columns and second columns with each of the first and second columns arranged in a first direction of the flexible display;
second wirings connected to the first wirings through the connection holes;
gate lines and data lines intersecting each other within the active area;
voltage applying lines parallel with the data lines;
a thin film transistor provided for each sub-pixel and connected to the gate line and data line;
an organic light emitting diode provided for each subpixel and respectively connected to the thin film transistor;
a drive IC provided in the non-display area of the flexible base film; and
a second flexible base film configured to cover the first flexible base film except for the drive IC,
wherein, when the flexible base film is folded along a folding axis in a direction intersecting the first and second columns, the folding axis intersects at least one connection hole of the first and second columns.

20. The flexible display according to claim 19, wherein each organic light emitting diode includes a first electrode connected to the thin film transistor, an organic light emitting layer provided on the first electrode, and a second electrode provided on the organic light emitting layer.

21. The flexible display according to claim 20, wherein the second wirings is electrically connected to first electrode or the second electrode.

22. The flexible display according to claim 19, wherein the second flexible base film includes a touch electrode array on a surface thereof facing the flexible base film.

23. The flexible display according to claim 19, wherein a direction of the folding axis is substantially perpendicular to the first direction.

* * * * *